(12) United States Patent
Yadav et al.

(10) Patent No.: US 7,029,507 B2
(45) Date of Patent: Apr. 18, 2006

(54) POLISHING USING MULTI-METAL OXIDE NANOPOWDERS

(75) Inventors: Tapesh Yadav, Longmont, CO (US); Karl Pfaffenbach, Longmont, CO (US)

(73) Assignee: NanoProducts Corporation, Longmont, CO (US)

( * ) Notice: Subject to any disclaimer, the term of this patent is extended or adjusted under 35 U.S.C. 154(b) by 292 days.

(21) Appl. No.: 10/292,263

(22) Filed: Nov. 12, 2002

(65) Prior Publication Data
US 2003/0132420 A1    Jul. 17, 2003

Related U.S. Application Data

(60) Provisional application No. 60/334,336, filed on Nov. 29, 2001.

(51) Int. Cl.
  *B24D 3/02*   (2006.01)
  *C09C 1/68*   (2006.01)
  *C09K 3/14*   (2006.01)

(52) U.S. Cl. .............................. 51/307; 51/308; 51/309; 75/343

(58) Field of Classification Search .......... 51/307–309; 423/289, 345, 409, 412, 439, 659; 75/343, 75/362, 351–353, 363
See application file for complete search history.

(56) References Cited

U.S. PATENT DOCUMENTS

| | | | | |
|---|---|---|---|---|
| 4,851,262 | A | * | 7/1989 | McFeaters ................... 427/217 |
| 5,472,477 | A | * | 12/1995 | Konig ........................... 75/343 |
| 5,851,507 | A | * | 12/1998 | Pirzada et al. .............. 423/659 |
| 5,984,997 | A | * | 11/1999 | Bickmore et al. ............ 75/343 |
| 6,068,787 | A | * | 5/2000 | Grumbine et al. ......... 252/79.1 |
| 6,719,821 | B1 | * | 4/2004 | Yadav et al. ................... 75/343 |

* cited by examiner

*Primary Examiner*—Duy-Vu N. Deo
(74) *Attorney, Agent, or Firm*—Kent A. Lembke; Hogan & Hartson L.L.P.

(57) ABSTRACT

Polishing powders of nanoscale dimensions are disclosed. Complex, multi-metal oxides are disclosed as constituents for chemical mechanical planarization, (CMP) as well as polishes for optical components, photonic devices, and other applications.

15 Claims, 3 Drawing Sheets

POLISHING USING MULTI-METAL OXIDE NANOPOWDERS

The present application claims priority to provisional application No. 60/334,336, filed Nov. 29, 2001, entitled "Polishing Using Multi-Metal Oxide Nanopowders" which is assigned to the assignee of the present invention and which is incorporated herein by reference.

BACKGROUND OF THE INVENTION

1. Field of the Invention

The present invention relates, in general, to polishing slurries comprising multi-metal oxide nanoscale powders and methods for their manufacture and use.

2. Relevant Background

Polishing of surfaces is employed in chip manufacturing, telecom component manufacturing, data storage product manufacturing, and optical component manufacturing. Polishing and abrasive cleaning of surfaces is also employed in numerous other industrial and consumer products. This technology currently uses sub-micron particles of single metal oxides such as alumina, silica, ceria, zirconia, and titania. However, with increasingly complex surfaces, both hard and soft, novel polishing slurries are desired.

Nanopowders in particular and sub-micron powders in general are a novel family of materials whose distinguishing feature is that their domain size is so small that size confinement effects become a significant determinant of the material's performance. Such confinement effects can, therefore, lead to a wide range of commercially important properties. Nanopowders, therefore, are an extraordinary opportunity for design, development and commercialization of a wide range of devices and products for various applications. Furthermore, since they represent a whole new family of material precursors where conventional coarse-grain physiochemical mechanisms are not applicable, these materials offer unique combination of properties that can enable novel and multifunctional products of unmatched performance. A commonly-owned patent Bickmore et al. in U.S. Pat. No. 5,984,997, which along with the references contained therein are hereby incorporated by reference in full, teach some applications of sub-micron and nanoscale powders. Co-pending application Ser. No. 09/638,977, which along with the references contained therein are hereby incorporated by reference in full, teaches methods for producing very high purity nanoscale materials and their applications.

In U.S. Pat. No. 6,068,787, which along with its references is herewith incorporated herein in full, Grumbine et al. (Cabot Corp.) report a chemical mechanical polishing precursor comprising at least one catalyst having multiple oxidation states, and at least one stabilizer, the composition being useful when admixed with an oxidizing agent prior to use to remove metal layers from a substrate. This method is used to facilitate the formation of oxides from various metal layers. This approach does not address the significant difference in the hardness of soft materials and the powders used in CMP slurries.

In U.S. Pat. No. 6,063,306, which along with its references is herewith incorporated herein in full, Kaufman et al. (Cabot Corp) report using alumina, titania, ceria, silica, and zirconia to prepare CMP slurries for polishing metals and nitrides. They report a good metal selectivity. However, the other issues such as dishing, pitting etc. are not addressed in this report.

In U.S. Pat. No. 6,045,435, which along with its references is herewith incorporated herein in full, Bajaj et al. (Motorola) report a low selectivity CMP process to address the problem of dishing. They discuss in significant detail the problems with dishing when conventional abrasives are used. Their approach is to trade-off selectivity for the uniformity and quality of the polish.

In most applications, polishing slurries need to satisfy a complex combination of functional and processing requirements. Single metal oxide sub-micron powders in general, and nanoscale powders in particular fail to meet all these requirements. This invention is directed to address this limitation.

Definitions

Fine powders, as the term used herein, are powders that simultaneously satisfy the following:
1. particles with mean size less than 100 microns, preferably less than 10 microns, and
2. particles with aspect ratio between 1 and 1,000,000.

Submicron powders, as the term used herein, are fine powders that simultaneously satisfy the following:
1. particles with mean size less than 1 micron, and
2. particles with aspect ratio between 1 and 1,000,000.

Nanopowders (or nanosize powders or nanoscale powders or nanoparticles), as the term used herein, are fine powders that simultaneously satisfy the following:
1. particles with mean size less than 250 nanometers, preferably less than 100 nanometers, and
2. particles with aspect ratio between 1 and 1,000,000.

Single metal oxide (or simple oxide), as the term is used herein, are powders whose composition comprises of a single metal and oxygen.

Multi-metal oxide (or complex oxide), as the term is used herein, are powders whose composition comprises of at least two metals and oxygen.

Pure powders, as the term used herein, are powders that have composition purity of at least 99.9%, preferably 99.99% by metal basis.

Powder, as the term is used herein encompasses hollow, dense, porous, semi-porous, coated, uncoated, layered, laminated, simple, complex, dendritic, inorganic, organic, elemental, non-elemental, composite, doped, undoped, spherical, non-spherical, surface functionalized, surface non-functionalized, stoichiometric, and non-stoichiometric form or substance.

SUMMARY OF THE INVENTION

Briefly stated, the present invention involves the preparation of nanoscale powders of complex compositions. More specifically, the invention relates to nanopowders for polishing applications. Methods for producing such polishing powders in high volume, low-cost, and reproducible quality are also outlined.

DETAILED DESCRIPTION OF THE PREFERRED EMBODIMENTS

Figure 1C:
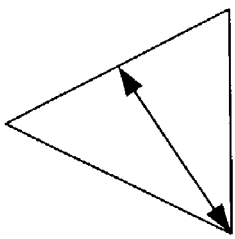
FIG. 1A through FIG. 1E illustrate various polishing nanoparticles in accordance with the present invention.
Figure 1B:
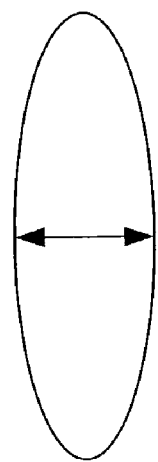
Figure 1E:
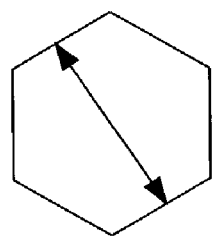
Figure 1A:
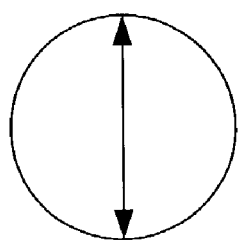
Figure 1D:
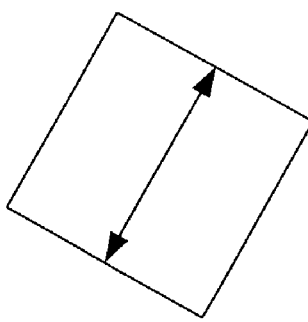

The constant push towards sub micrometer miniaturization of device dimensions, and increased density of devices, combined with the development of new interconnect technologies (such as copper and low K polymer based dielectrics) has led to the introduction and rapid development of chemical-mechanical planarization (CMP) technology in semiconductor manufacturing. CMP has now emerged as the most effective method of achieving global planarization in multilevel circuits with feature sizes less than 0.5 mm. Advanced metallization schemes are required to obtain performance benefits of device scaling dimensions in the sub 0.5 microns regime. With decrease in the feature size, the interconnect delay measured by RC (resistance x capacitance of a circuit) increases non-linearly and is much larger than the delay in switching the transistor (gate delay). It has been shown that for feature size of 180 nm, the interconnect delay is the rate limiting factor for faster devices. To counter the adverse effect of RC time delay, new multilevel metallization (MLM) schemes, which span several planes and are isolated by dielectric insulating layers have been developed. In MLM schemes, the scaling factor for a decrease in the dimension size of the interconnects is less aggressive than that at the gate level. Presently schemes with up to 6 metal layers have been developed to counter the adverse effects of RC delay. Concomitantly to further reduce the RC delay and decrease the number of levels, low resistivity materials such as copper and low dielectric constant materials such as fluorinated silica, carbon and polymers can be used. It is estimated that by using low K polymeric materials and copper, the number of metallization levels can be reduced from 12 to 6 levels for 0.13 micron devices.

In multilevel metallization or interconnection scheme, the metal interconnections are not confined to one plane; they span several planes and are isolated by insulating layers and connected by the wiring in the third dimensions through holes in the dielectric planes. The problem associated with MLM structures are all related to deposition, exacting alignments (lithography, patterning and etching), planarization, etc. In comparison to conventional planarization technologies such as bias sputtering, dry etching, and etch back process, chemical mechanical polishing offer more versatility, simplicity and better global planarization and can be applied to all type of materials. In this method the surface to be planarized is held at pressure against a rotating polishing pad soaked with an abrasive slurry. Besides addressing the need for global planarization, the CMP process is the only method for making patterning lines of materials such as copper, which is difficult to etch and pattern using dry etching methods. This method known as the "damascene" or "inlaid approach" deposits blanket copper on silica which has been patterned with trenches. The trenches define the conductive interconnects which remain after CMP polishing to remove the top continuous overlayer.

The CMP process synergistically combines both tribological and chemical effects to planarize metal and insulating materials such as copper, tungsten, silica and polymers. Besides global planarization and high polish rate, the CMP process should also achieve high material selectivity (high polishing rate of one material compared to the other), and high quality surface finish which is devoid of scratches, pits and particle contamination. Each material to be polished has its own specific chemistry (type of abrasive, chemicals, etc.) to achieve optimized characteristics. Typically the slurry contains small (<300 nm) abrasive particles (alumina or silica) at concentrations ranging from 1 to 10%. Several chemical and additives (surfactants, stabilizers, etc.) may be added to provide the right chemistry and also stabilize the slurry itself.

For the next generation of semiconductor and optical devices manufacturing, the push is towards the use of new materials such as copper and silver and low K dielectric polymeric materials such as (parylene, teflon-based polymers, aerogels, etc.). These materials pose a new set of challenges for the materials and the process used in CMP. Some of the key issues are outlined below:

(i) The low resistivity (copper and silver) and low K materials are typically much softer than the conventional materials being presently used (tungsten & silica) in the interconnect technology. For example, the microhardness of copper is about 80 Kg/mm2 (Mohs scale 2.5) which is much less than silica (1200 kg/mm2 [Mohs scale 6–7]), alumina (2000 kg/mm2 [Mohs scale 9]). The CMP of soft surfaces using silica and alumina based slurries, which are being presently used, results in a high degree of surface scratches on the metal or dielectric film. Also, pits and craters may be observed on the soft film.

(ii) The large differences in the hardness of the metal and the slurry abrasive can further accentuate a special type of defect known as "dishing". This dishing effect is characterized by higher polishing rates in the softer media (e.g. copper) when located besides a harder media (such as silica). The juxtaposition of these two surfaces is required to fabricate thin copper lines using the damascene approach. Besides pad parameters, the dishing effect has been found to increase using particles of high hardness (such as alumina and silica) in the slurries. The formation of the trough shaped dish has been attributed to the low hardness of copper and the distortion of the pad.

(iii) Typically the slurry particles used in CMP possess a particle size less than 300 nm. The surface defects during CMP polishing have been found to decrease as the size of the particle decreases. However, smaller particles are more difficult to remove from the surface. This is due to the fact that directed forces are very difficult to apply when the particle size decreases. Methods and process chemistries that promote nanoparticle detachment thus represent a key issue in design of next generation slurries.

(iv) In order to compensate for the inherent and fixed properties of single metal oxide particles, high ionic strength additives and oxidizers are added to the slurry which makes the slurry particles inherently unstable. The interaction of the electric double layer between particle is further decreased when the particle size decreases below 100 nm. This makes next generation slurry design challenging.

(v) It is expected that the next generation of semiconductors, data storage, optical, and superlattice devices (e.g. thermoelectrics) will require planarization of surfaces with feature sizes less than 100 nm, and in some cases below 25 nm. This also makes next generation slurry design challenging.

These issues indicate that conventional slurries containing alumina and silica with large particle size (>300 nm) may not represent the best solution for CMP of next generation of low hardness materials (copper, silver, polymers) and hard materials with order of magnitude less feature sizes. New types of abrasives need to be developed to address the future need.

To practice this invention, nanoparticles can be produced by any available technique.

A preferred technique for the present invention is to prepare nanoscale powders from environmentally benign, safe, readily available, high metal loading, lower cost fluid precursors. The precursor may be a gas, single-phase liquid, multiphase liquid, a melt, fluid mixtures and combinations thereof. Illustration of precursors includes but does not limit to metal acetates, metal carboxylates, metal ethanoates, metal alkoxides, metal octoates, metal chelates, metallo-organic compounds, metal halides, metal azides, metal nitrates, metal carbonates, metal sulfates, metal hydroxides, metal salts soluble in organics or water, metal containing emulsions. Multiple metal precursors may be mixed if complex powders are desired.

Once the pure precursor is available, it is processed at high temperatures to form the product powder. Products such as powders produced from these precursors are pure. It is important to ensure that the method of producing the product and the environment in which these products are produced are pure and compatible with the chemistry involved.

The high temperature processing is conducted at step 103 at temperatures greater than 1750 K, preferably 2750 K, more preferably greater than 3250 K, and most preferably greater than 4250 K. Such temperatures may be achieved by any method such as, but not limited to, plasma processes, combustion, pyrolysis, electrical arcing in an appropriate reactor. The plasma may provide reaction gases or just provide a clean source of heat. A preferred embodiment is to atomize and spray the feed in a manner that enhances heat transfer efficiency, mass transfer efficiency, momentum transfer efficiency, and reaction efficiency. Method and equipment such as those taught in U.S. Pat. Nos. 5,788,738; 5,851,507; and 5,984,997 (and which are herewith incorporated by reference) are illustrations of various ways the teachings herein can be practiced.

In the preferred embodiment, the high temperature processing method has instrumentation that can assist the quality control. Furthermore it is preferred that the process is operated to produce fine powders as shown in FIG. 1A through FIG. 1E, preferably submicron powders, and most preferably nanopowders. The gaseous products from the process may be monitored for composition, temperature and other variables to ensure quality. The gaseous products may be recycled or used as a valuable raw material when powders have been formed in an integrated manufacturing operation.

Once the product fine powders have been formed, it is preferred that they be quenched to lower temperatures to prevent agglomeration or grain growth by methods such as, but not limited to, methods taught in the U.S. Pat. No. 5,788,738. It is preferred that methods be employed that can prevent deposition of the powders on the conveying walls. These methods may include electrostatic, blanketing with gases, higher flow rates, mechanical means, chemical means, electrochemical means, or sonication/vibration of the walls.

The product fine powders may be collected by any method. Some illustrative approaches without limiting the scope of this invention are bag filtration, electrostatic separation, membrane filtration, cyclones, impact filtration, centrifugation, hydrocyclones, thermophoresis, magnetic separation, and combinations thereof. FIG. 1A through FIG. 1E illustrate various shapes of nanoparticles that are suitable for polishing in accordance with the present invention. In FIG. 1A through FIG. 1E, the double headed arrow represents the domain size which is less than 250 nm, preferably less than 100 nm.

Figure 2:
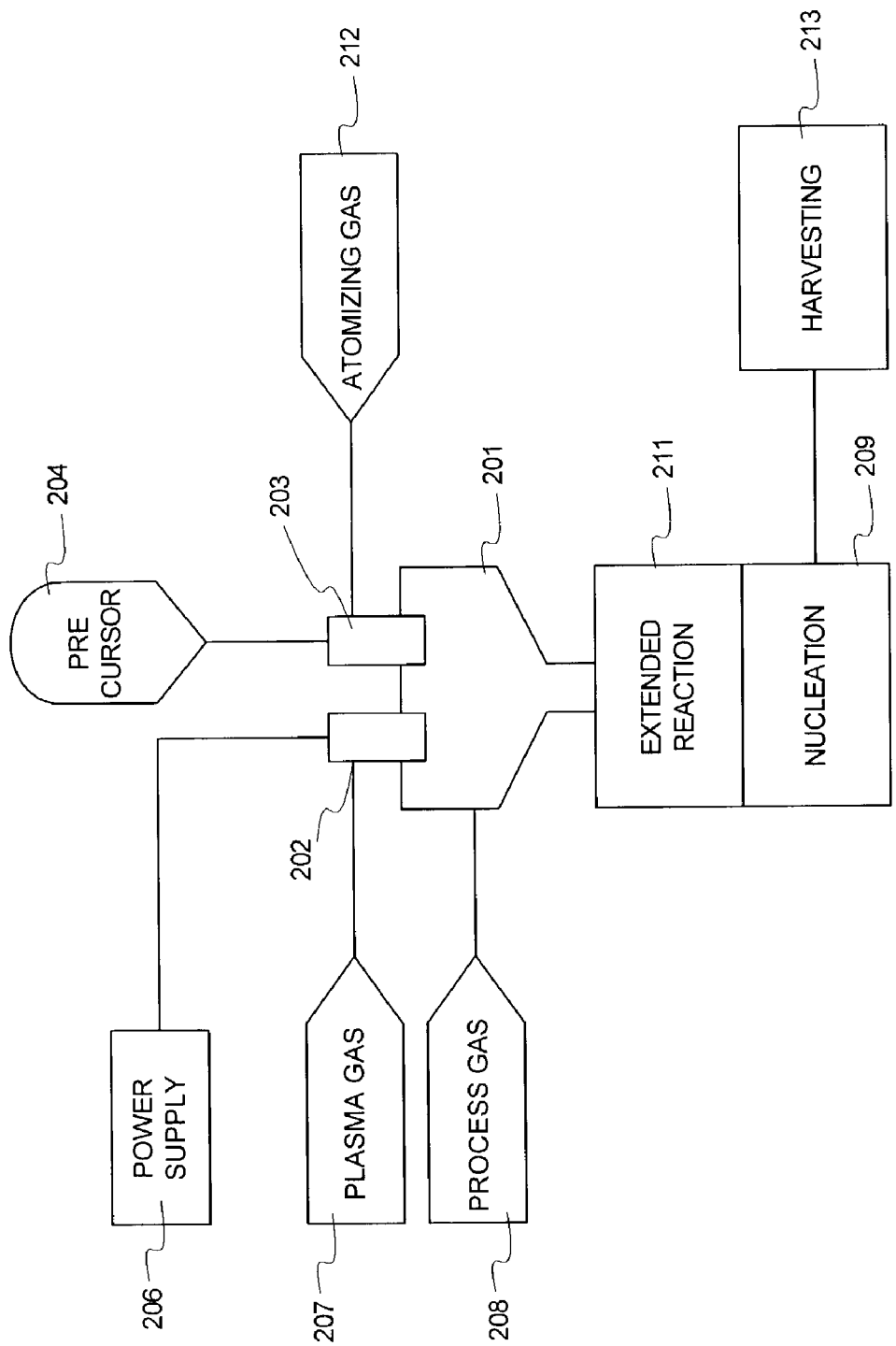
FIG. 2 shows an exemplary overall approach for production of polishing powders in accordance with the present invention.
Figure 3:
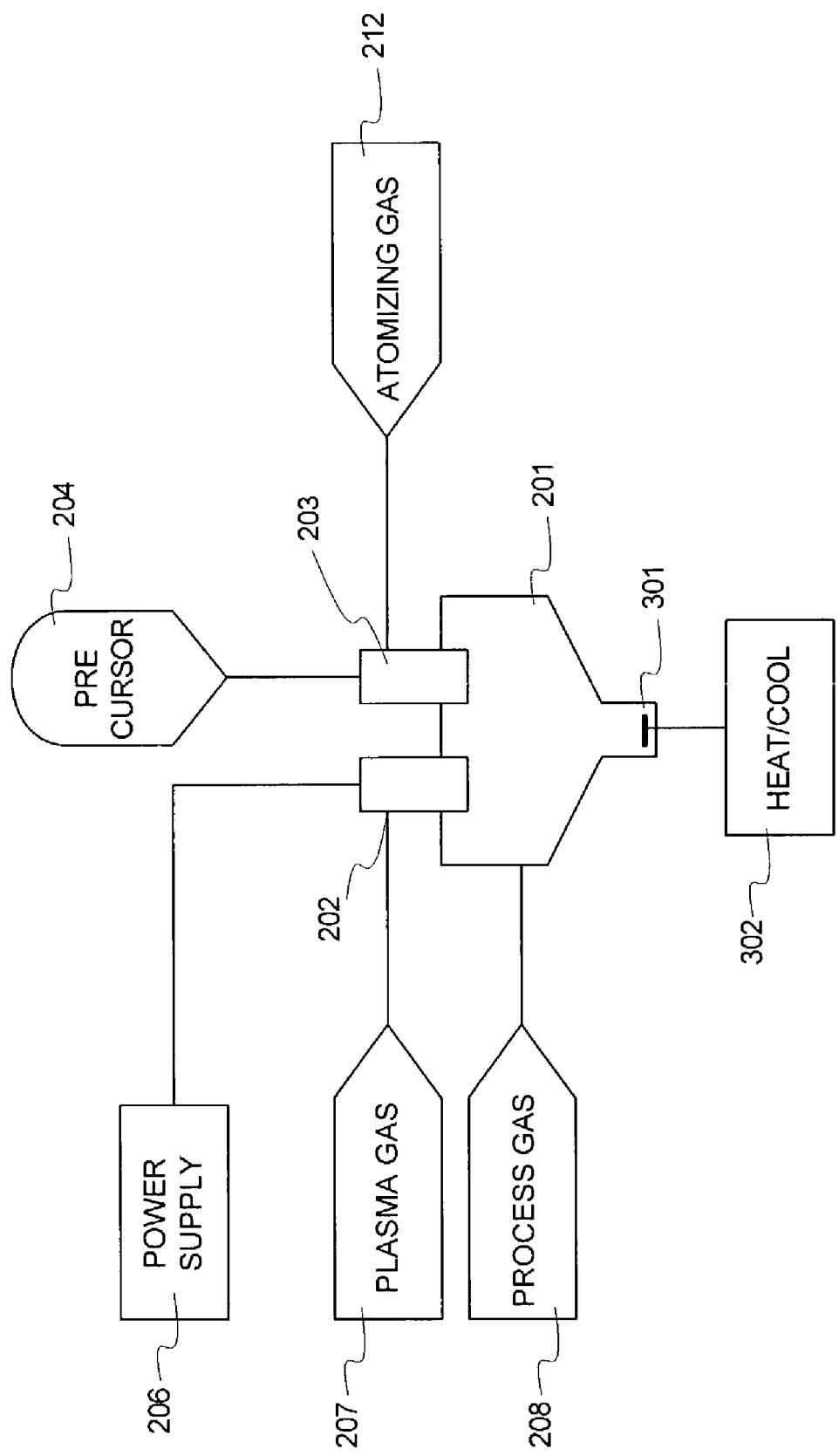
FIG. 3 illustrates an alternative approach for production of polishing powders in accordance with the present invention.

FIG. 2 shows a schematic flow diagram of a thermal process for the synthesis of nanoscale powders as applied to precursors such as metal containing emulsions, fluid, or water soluble salt such as nitrates and acetates. Although a single precursor storage tank 204 is shown in FIG. 2, it should be understood that multiple precursor tanks may be provided and used with or without premixing mechanisms (not shown) to premix multiple precursors before feeding into reactor 201. A feed stream of a precursor material is atomized in mixing apparatus 203. The precursor storage 204 may alternatively be configured by suspending the precursor in a gas, preferably in a continuous operation as best suited to the nature of the precursor. The resulting suspension is advantageously preheated in a heat exchanger (not shown) preferably with the exhaust heat and then is fed into a thermal reactor 201 where the atomized precursors are partially or, preferably, completely transformed into vapor form. The source of thermal energy in the preferred embodiments is heat of combustion combined with plasma generator 202 powered by power supply 206. Plasma gas 207, which may be inert or reactive, is supplied to plasma generator 202. Alternatively, the source of thermal energy may be internal energy, heat of reaction, combustion, conductive, convective, radiative, non-transferred arc plasma, transferred arc plasma, inductive, microwave, electromagnetic, direct or pulsed electric arc, nuclear, or combinations thereof, so long as sufficient to cause the rapid vaporization of the precursor being processed and the formation of hot elemental vapor. Optionally, in order to prevent contamination of the vapor stream caused by partial sublimation or vaporization, the walls of reactor 201 may be pre-coated with the same material being processed.

The hot elemental vapor next enters an extended reaction zone 211 of the thermal reactor that provides additional residence time, as needed to complete the processing of the feed material and to provide additional reaction and forming time for the vapor (if necessary). Before the stream leaves the reactor, it passes through a zone 209 where the thermokinetic conditions favor the nucleation of solid powders from the vaporized precursor. These conditions are determined by the supersaturation and the thermokinetic states. Rapid cooling of vapor and highly concentrated feeds lead to high supersaturation which gives rise to homogeneous nucleation. The zones 201, 211, and 209 may be combined and integrated in any manner to enhance material, energy, momentum, and/or reaction efficiency.

As soon as the vapor has nucleated, the process stream is quenched in heat removal apparatus within nucleation zone 209 comprising, for example, a converging-diverging nozzle-driven adiabatic expansion chamber at rates at least exceeding 1000 K/sec, preferably greater than 1000000 K/sec, or as high as possible. A cooling medium (not shown) may be utilized for the converging-diverging nozzle to prevent contamination of the product and damage to the expansion chamber. Rapid quenching, preferably near sonic or supersonic fluid dynamics, ensures that the powder produced is homogeneous, its size is uniform and the mean powder size remains in submicron scale.

The quenched gas stream is cooled or processed further if desired and then filtered in appropriate separation equipment in harvesting region 213 to remove the powder product from the gas stream. As well understood in the art, the filtration can be accomplished by single stage or multistage impingement filters, electrostatic filters, screen filters, fabric filters, cyclones, scrubbers, magnetic filters, or combinations thereof. The filtered nanopowder product is then harvested from the filter either in batch mode or continuously and then transported using screw conveyors or gas-phase solid transport or other methods known in the art. The product stream is conveyed to post-powder processing unit where the polishing slurry is prepared. This may involve the use of acids, alkalis, oxidizers (such as hydrogen peroxide, potassium iodate and citric acid), catalysts, oligomers, monomers, polyelectrolytes, surfactants, dispersants, polymers, polyethylenimies, and other compositions. The slurry preparation may involve thermal treatment of the powder, surface modification, shear mixing or sonication to break soft agglomeration, or a combination of these and similar techniques.

A preferred embodiment of this invention is the surprising discovery that multi-metal oxides in nanostructured form (that is, less than 250 nm mean size) offer a means to engineer the hardness, chemical potential, and other properties of the particle. Thus, one way to practice the teachings herein is as follows—(a) prepare nanoparticles with a composition comprising at least two metals from the group comprising: aluminum, silicon, copper, cerium, zirconium, rare earth, alkaline earth, tungsten, titanium, iron, nickel, cobalt, zinc, tin, boron, platinum, palladium, silver, gold, hafnium, and manganese, (b) disperse the nanoparticles in solvent, (c) add additional additives to prepare a polishing slurry. The solvent can be water or an organic solvent. The additives can be acids, alkalis, detergents, oxidizers, reducers, dispersants, catalysts, enzymes, or emulsifying agents. In some cases, no additives may be used. If the application requires purities greater than 99.9% by metal basis, the teachings herein can be applied by starting with fluid raw materials with purities greater than 99.9% by metal basis. If the application requires purities greater than 99.99% by metal basis, the teachings herein can be applied by starting with fluid raw materials with purities greater than 99.99% by metal basis. Even higher purities are achievable.

One of ordinary skill in the art will realize that other modifications, such as using no additives or mixing more than one nanoparticle compositions or complex solvents and other similar variations can also be used.

EXAMPLES 1–4

Aluminum Silicates

Organometallic aluminum and silicon liquid precursors were blended by weight in the weight ratio desired in the aluminum silicate nanopowders. The precursor was fed at various volumetric feed rate into a Joule Thompson Thermal Quench reactor and combusted in the presence of plasma at temperatures above 2000 C, with peak plasma temperatures above 3000 C. The reactor pressure was sub-atmospheric. The vapor was cooled to nucleate the nanopowders and the nanopowder containing gases were then quenched by expanding the process stream through a nozzle. The powders were collected using a powder separation system. Table 1 summarizes the results.

TABLE 1

Aluminum Silicates Prepared

| Composition (wt % Al2O3/SiO2) | Vol. Feed Rate (mL/min) | XRD Major Phase | BET S.S.A. (m²/g) | BET E.S.D. (nm) |
|---|---|---|---|---|
| 30/70 | 20.23 | Amorphous | 30.8 | 69.8 |
| 40/60 | 100 | Amorphous | 24.3 | 82.9 |
| 55/45 | 100 | Amorphous | 21.9 | 83.5 |
| 72/28 | 21.97 | Mullite | 17.9 | 106.2 |

The XRD data indicated that the nanoscale powders are different than pure alumina and silica nanopowders. Table 2 shows the effect of composition on the hardness of a material. These tables suggest that the nanopowders of multi-metal oxide and non-oxide compositions can offer a hardness that is different than the hardness of single metal oxides alumina or silica.

TABLE 2

Hardness of various materials

| Composition | Hardness Mohs |
|---|---|
| Aluminate Oxide | 8–9 |
| Silica | 7 |
| 50/50 Aluminum Silicate | 7.5 |
| Magnesium Silicate | 1 |
| Calcium Magnesium Silicate | 5.5 |
| Potassium Aluminum Silicate | 6 |
| Sodium Borate (Borax) | 2.3 |
| Calcium Borate | 4.5 |
| Zirconium Silicate | 7.5 |
| Silicon Carbode | 9.3 |

TABLE 2-continued

Hardness of various materials

| Composition | Hardness Mohs |
|---|---|
| Zirconium Nitride | 8+ |
| Diamond | 10 |

EXAMPLE 5–6

Zirconium Silicates

Organometallic zirconium and silicon liquid precursors were blended by weight in the weight ratio desired in the zirconium silicate nanopowders. The precursor was combusted in the presence of plasma at temperatures above 2000 C, with peak plasma temperatures above 3000 C. The reactor pressure was sub-atmospheric. The vapor was cooled to nucleate the nanopowders and the nanopowder containing gases were then quenched by expanding the process stream through a nozzle. The powders were collected using a powder separation system. Table 3 summarizes the results.

TABLE 3

Zirconium Silicates Prepared

| Composition (wt % $ZrO_2$:$SiO_2$) | BET S.S.A. $m^2$/gm | BET E.S.D. nm | XRD Particle Size (nm) |
|---|---|---|---|
| Zirconium Silicate (1:1) | >70 | <30 | <20 |
| Zirconium Silicate (1.0:5.5) | >100 | <25 | <15 |

The X-ray diffractometer (XRD) data indicated that the nanoscale powders are different than pure zirconia and silica nanopowders.

Cerium or tungsten or tantalum or copper or other metal containing multi-metal oxides can be prepared in the same manner. Table 4 presents non-limiting specific examples of precursors that can be employed to produce nanoscale powders. Catalysts and dopants may be added to the composition. By controlling the level of oxygen in the feed, non-stoichiometric polishing powder compositions may be formed. For a given application, it may be better to utilize polishing material of composition similar to the surface being polished. In other applications where slurry particle removal is important or difficult, iron or other magnetic metals may be used to form polishing powders and then after polishing a magnetic field may be used to remove the polishing powders.

TABLE 4

| Desired Composition | Precursor |
|---|---|
| Barium | Barium Carboxylate (OMG PLATISTAB ® 2116), Barium acetate |
| Zirconium | Zirconium 2-ethylhexanoate (SHEPHARD Zr VERSALATE ® 1394), zirconium acetate, zirconia sol, zirconium propionate |
| Aluminum | Aluminum organic complex (OMG 7% AOC), aluminum nitrate, aluminum acetate |
| Calcium | Calcium dimethylhexanoate (SHAPHARD Ca Versalate ® 1424), Calcium acetate |
| Silicon | Octamethylcyclotetrasiloxane (GELEST S106700.0) |
| Cerium | Cerium 2-ethylhexanoate (OMG 12% Cerium Hex-Cem ® 1024), Cerium acetate, Cerium nitrate, Cerium carbonate |
| Sodium | Sodium acetate |
| Potassium | Potassium acetate |
| Lithium | Lithium acetate |
| Magnesium | Magnesium acetate |
| Manganese | Manganese acetate, Manganese carboxylate |
| Titanium | Tetrakis(2-ethylhexyl) titanate (DUPONT TYZOR ® TOT) |

Using the above or similar precursors per the teachings herein, calcium silicate, barium silicate, barium aluminum silicate, calcium titanate, cerium zincate, potassium cerate, yttrium zirconate were successfully produced. In all cases, the XRD particle size was found to be less than 150 nm by Warren-Averbach analysis.

The novel nanostructured multi-metal compositions and methods for their manufacture as described can be utilized to prepare powders for other applications such as abrasives, additives, surface coatings, and dry polishing pads. Alternatively, the methods can be used to tailor various properties such as but not limiting to the hardness, density, electrical conductivity, catalytic properties, refractive index, magnetic properties, band gap, biocompatibility, hydrophilicity, hydrophobicity, color, luminescence, thermal conductivity or combination of these properties of a composition. Thus, an embodiment to practice the teachings herein in order to produce nanoparticles of a specified engineered combination of properties is as follows—(a) prepare nanoparticles with a composition comprising at least two metals from the group comprising: aluminum, silicon, copper, cerium, zirconium, rare earth, alkaline earth, tungsten, titanium, iron, nickel, cobalt, zinc, tin, boron, platinum, palladium, silver, gold, hafnium, and manganese, (b) vary the ratio of the metals in the nanoparticles to produce a set of nanoparticles with different compositions, (c) measure the properties of the nanoparticles with different compositions; (d) select the nanoparticle composition from the nanoparticles with different compositions that meet the specified engineered combination of properties. The selected nanoparticles may be dispersed in a solvent and added with additional additives to make them suitable for a given application. The solvent can be water or an organic solvent.

In one preferred embodiment, the nanostructured multi-metal powders have an average domain size of less than 100 nm and a purity greater than 99.9% by metal basis. In another preferred embodiment, the nanostructured multi-metal powders have an average domain size of less than 100 nm and a purity greater than 99.995% by metal basis. In yet another preferred embodiment, the nanostructured multi-metal powders have an average domain size of less than 50 nm and a purity greater than 99.99% by metal basis. In another preferred embodiment, the nanostructured multi-metal powders have an average domain size of less than 25 nm and a purity greater than 99.99% by metal basis. The multi-metal powders may be non-stoichiometric or stoichiometric, crystalline or amorphous, spherical or non-spherical.

Although the invention has been described and illustrated with a certain degree of particularity, it is understood that the present disclosure has been made only by way of example, and that numerous changes in the combination and arrangement of parts can be resorted to by those skilled in the art without departing from the spirit and scope of the invention, as hereinafter claimed.

We claim:

1. A process of producing a polishing slurry comprising:
    providing a feed composition wherein the feed composition comprises a blend of a first fluid precursor and a second fluid precursor, wherein the first fluid precursor comprises of the first metal and the second fluid precursor comprises of the second metal;
    introducing the feed composition into a reactor wherein the feed composition is converted into a vapor at a temperature greater than 3000 C;
    transforming the vapor into polishing powder; and
    dispersing the polishing powder in a solvent to form the polishing slurry.

2. The process of claim 1, where the temperature at which the feed composition is converted into a vapor is greater than 5000 C.

3. The process of claim 1, wherein the polishing powder comprises a submicron powder.

4. The process of claim 1, wherein the polishing powder comprises a nanoscale powder.

5. The process of claim 1, wherein the purity of the powder is greater than 99.9% on metal basis.

6. The process of claim 1, wherein the purIty of the powder is greater than 99.99% on metal basis.

7. The process of claim 1, wherein the powder comprises of an oxygen containing substance.

8. The process of claim 1, wherein the powder comprises a silicate.

9. The process of claim 1, wherein the powder is non-stoichiometric.

10. The process of claim 1 further comprising pretreating the polishing powder before forming the polishing slurry, wherein the pretreating comprises one or more process(es) selected from the group consisting of: thermal treatment, surface modification, shear mixing, and sonication.

11. The process of claim 1 further comprising combining one or more additives wIth the polishing slurry wherein the additives are selected from the group consisting of: acids, alkalis, detergents, oxidizers, reducers, dispersants, catalysts, enzymes, and emulsifying agents.

12. The process of claim 1, wherein the blend further comprises of additional fluid precursors.

13. A method for producing a polishing slurry comprising:
    preparing nanoparticles with a composition comprising at least two metals selected from the group comprising: aluminum, silicon, copper, cerium, zirconium, rare earth, alkaline earth, tungsten, titanium, iron, nickel, cobalt, zinc, tin, boron, platinum, palladium, silver, gold, hafnium, and manganese, wherein the preparing comprises introducing the composition into a reactor wherein the composition is converted into a vapor at a temperature greater than 3000 C and transforming the vapor into the nanoparticles;
    wherein the hardness of the nanoparticles with a composition comprising at least two metals is different than the hardness of single metal oxides of alumina and silica;
    dispersing the nanoparticles in water or organic solvent; and
    adding additional additives thereby preparing a polishing slurry.

14. The method of claim 13 wherein the nanoparticles with a composition comprising at least two metals comprises a multi-metal oxide.

15. The method of claim 13 wherein the additional additives are selected from the group consisting of: acids, alkalis, detergents, oxIdizers, reducers, dispersants. catalysts, enzymes, and emulsifying agents.

* * * * *